(12) United States Patent
Kim

(10) Patent No.: US 9,035,324 B2
(45) Date of Patent: May 19, 2015

(54) LIGHT EMITTING DEVICE

(75) Inventor: Taek Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 169 days.

(21) Appl. No.: 12/801,275

(22) Filed: Jun. 1, 2010

(65) Prior Publication Data

US 2011/0095260 A1 Apr. 28, 2011

(30) Foreign Application Priority Data

Oct. 28, 2009 (KR) .................. 10-2009-0102819

(51) Int. Cl.
| | |
|---|---|
| *H01L 33/04* | (2010.01) |
| *H01L 27/15* | (2006.01) |
| *H01L 33/08* | (2010.01) |
| *H01L 33/20* | (2010.01) |

(52) U.S. Cl.
CPC ............... *H01L 27/156* (2013.01); *H01L 33/08* (2013.01); *H01L 33/20* (2013.01)

(58) Field of Classification Search
CPC ..... H01L 33/08; H01L 33/38; H01L 25/0756; H01L 27/15; H01L 33/508; H01L 27/153; H01L 33/20; H01L 27/156; H01L 2224/24145; H01L 27/3209; H01L 2924/12041; H01L 51/5012; H01L 33/48
USPC .............................. 257/79–103, 13
See application file for complete search history.

(56) References Cited

U.S. PATENT DOCUMENTS

| | | | | |
|---|---|---|---|---|
| 5,332,910 | A * | 7/1994 | Haraguchi et al. ............. 257/13 |
| 5,684,309 | A * | 11/1997 | McIntosh et al. ............ 257/191 |
| 6,307,218 | B1 * | 10/2001 | Steigerwald et al. .......... 257/99 |
| 2003/0047742 | A1 * | 3/2003 | Hen .............................. 257/89 |
| 2005/0184305 | A1 * | 8/2005 | Ueda ............................. 257/99 |
| 2005/0194598 | A1 * | 9/2005 | Kim et al. ...................... 257/79 |
| 2006/0043385 | A1 * | 3/2006 | Wang et al. .................... 257/79 |
| 2006/0231845 | A1 * | 10/2006 | Chen ............................. 257/79 |
| 2007/0069218 | A1 * | 3/2007 | Chen et al. ..................... 257/79 |
| 2007/0267650 | A1 * | 11/2007 | Hsieh ............................. 257/99 |
| 2008/0157057 | A1 * | 7/2008 | Kim .............................. 257/13 |
| 2008/0210956 | A1 * | 9/2008 | Kim .............................. 257/88 |
| 2010/0019247 | A1 * | 1/2010 | Joichi et al. .................... 257/76 |
| 2010/0032691 | A1 * | 2/2010 | Kim .............................. 257/88 |
| 2010/0078625 | A1 * | 4/2010 | Hsu .............................. 257/13 |

FOREIGN PATENT DOCUMENTS

| | | |
|---|---|---|
| KR | 10-2005-0081139 | 8/2005 |
| KR | 10-0579320 | 5/2006 |
| KR | 10-2007-0088006 | 8/2007 |
| KR | 10-2009-0053307 | 5/2009 |
| WO | WO 2008041770 A1 * | 4/2008 |

* cited by examiner

*Primary Examiner* — Asok K Sarkar
*Assistant Examiner* — Dmitriy Yemelyanov
(74) *Attorney, Agent, or Firm* — Harness, Dickey & Pierce, P.L.C.

(57) ABSTRACT

A light emitting device may include a semiconductor light emitting diode which may include a first nitride semiconductor layer doped as an n-type, a second nitride semiconductor layer doped as a p-type, and a first active layer provided between the first and second nitride semiconductor layers, and a nano light emitting diode array in which a plurality of nano light emitting diodes may be arranged on the semiconductor light emitting diode so as to be separated from each other.

20 Claims, 3 Drawing Sheets

LIGHT EMITTING DEVICE

CROSS-REFERENCE TO RELATED APPLICATION

This application claims priority under 35 U.S.C. §119 to Korean Patent Application No. 10-2009-0102819, filed on Oct. 28, 2009 with the Korean Intellectual Property Office, the disclosure of which is incorporated herein in its entirety by reference.

BACKGROUND

1. Field

The present disclosure relates to a light emitting device configured to produce white light or pseudo-white light without using a fluorescent material.

2. Description of the Related Art

Light emitting diodes (LEDs) using semiconductors are a relatively efficient, environmentally-friendly light source and have been used in a variety of fields including displays, optical communications, automobiles, and general lightings. In particular, a demand for white light emitting diodes has been increasing.

To produce white light, a fluorescent material may be used. For example, after an ultraviolet (UV) LED emits an UV ray, red, green, and blue fluorescent materials are excited by the UV ray so as to emit red, green, and blue lights, thereby obtaining the white light. Also, yellow light may be emitted by exciting a yellow fluorescent material that is a complementary color to a blue LED used as a light source so that the white light may be obtained.

As a method of producing a white color by using the LED only and without a fluorescent material, LEDs (each emitting one of red, green, and blue visible rays) are combined. For example, an LED using an InGaN layer as a light emitting material is such that the emitted color varies according to a change in mole fraction of In in the InGaN layer. As the content of In increases, lattice constant increases and a relatively large lattice mismatch is generated between the InGaN layer of a thin layer and a base substrate. Thus, the efficiency in the light emission may be deteriorated from a relatively short wavelength to a relatively long wavelength.

SUMMARY

Example embodiments relate to a light emitting device which may produce white light or pseudo-white light without using a fluorescent material. The light emitting device may include a semiconductor light emitting diode including a first nitride semiconductor layer of an n-type, a second nitride semiconductor layer of a p-type, and a first active layer between the first and second nitride semiconductor layers, and a nano light emitting diode array including a plurality of nano light emitting diodes on the semiconductor light emitting diode.

Each of the plurality of nano light emitting diodes may include a third nitride semiconductor layer doped as a p-type, a fourth nitride semiconductor layer doped as an n-type, and a second active layer between the third and fourth nitride semiconductor layers. Each of the plurality of nano light emitting diodes may have a nanorod structure, a nano-pyramid structure, or a core-shell nanorod structure. The crystal surface where light emitting occurs may selectively be polar, semi-polar, or non-polar.

The light emitting device may further include a first electrode at an end portion of the first nitride semiconductor layer, a first transparent electrode layer on the second nitride semiconductor layer, a second electrode at an end portion of the first transparent electrode layer, a second transparent electrode layer on the fourth nitride semiconductor layer, and a third electrode at an end portion of the second transparent electrode layer. An insulation member may be between the first transparent electrode layer and the second transparent electrode layer.

The first electrode and the second electrode may be connected to each other, the second electrode and the third electrode may be connected to each other, and the semiconductor light emitting diode and the nano light emitting diode array may be independently driven.

The first active layer may include an InGaN based quantum well layer configured to emit blue light, and the second active layer may include an InGaN based quantum well layer configured to emit light of a wavelength that is mixed with the blue light to produce white light.

The first active layer may include an InGaN based quantum well layer configured to emit light of a first wavelength, and the second active layer may include an InGaN based quantum well layer configured to emit light of a second wavelength that is longer than the first wavelength through a smaller bandgap than that of the first active layer.

The first active layer and the second active layer may include a multi-quantum well layer formed of $In_xGa_{(1-x)}N$ $(0<x<1)/In_xAl_yGa_{(1-x-y)}N(0\leq x,y<1)$. The multi-quantum well layer may include a plurality of layers having different compositions of indium (In) in the layers formed of $In_xGa_{(1-x)}N(0<x<1)$.

BRIEF DESCRIPTION OF THE DRAWINGS

The above and/or other aspects of example embodiments may become more apparent and readily appreciated when the following description is taken in conjunction with the accompanying drawings of which.

DETAILED DESCRIPTION

Figure 1:
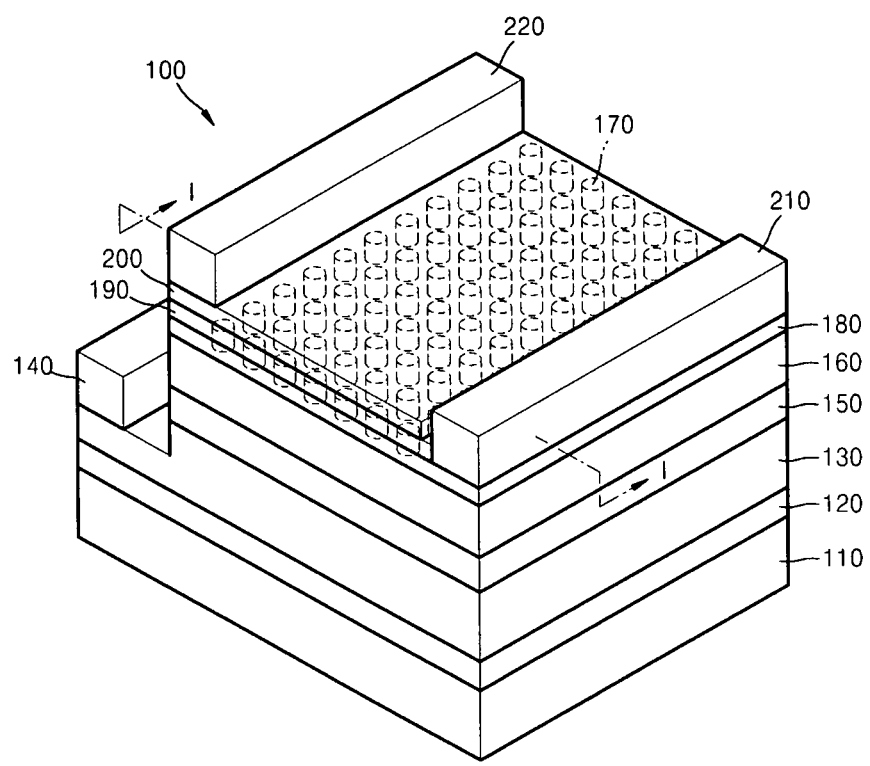
FIG. 1 is a perspective view of a light emitting device according to example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
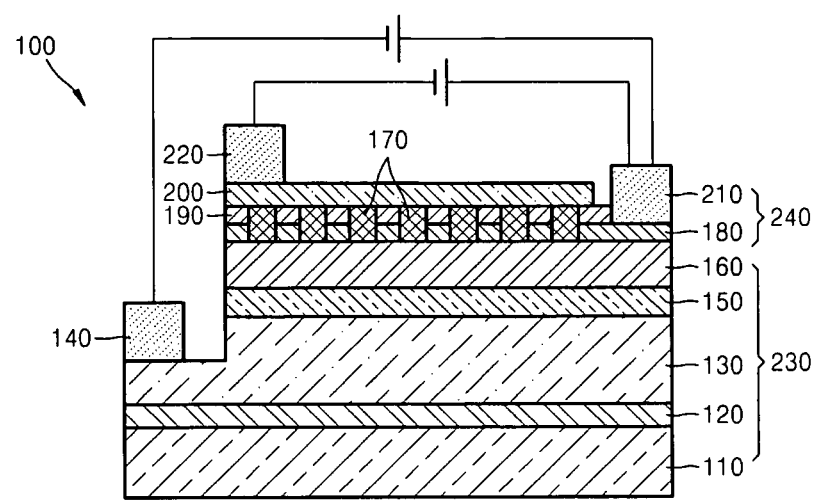
FIG. 2 is a cross-sectional view taken along line I-I of FIG. 1.
Figure 3A:
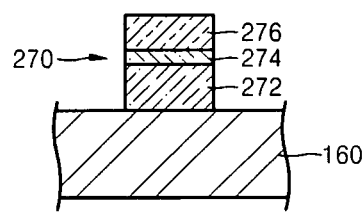
FIGS. 3A-3C are cross-sectional views of nano light emitting diodes that may be employed in the light emitting device of FIG. 1.
Figure 3B:
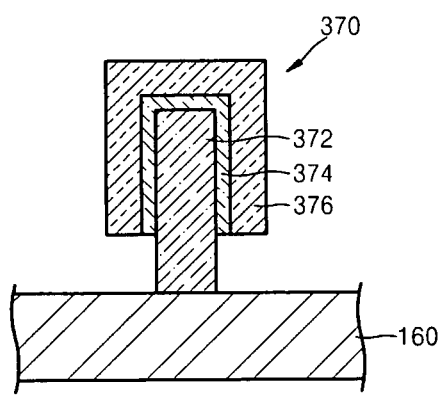
Figure 3C:
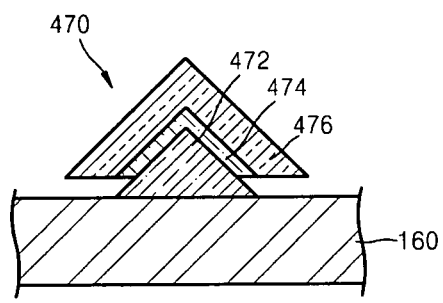

FIG. 1 is a perspective view of a light emitting device 100 according to example embodiments. FIG. 2 is a cross-sectional view taken along line I-I of FIG. 1. FIGS. 3A-3C are cross-sectional views of nano light emitting diodes that may be employed in the light emitting device 100 of FIG. 1.

Referring to FIGS. 1 and 2, the light emitting device 100 according to example embodiments may include a nano light emitting diode array 240 in which a plurality of nano light emitting diodes 170 driven by current injection may be arranged so as to be separated from each other. The light emitting device 100 may include a semiconductor light emitting diode 230, wherein the nano light emitting diode array 240 may be driven independently of the semiconductor light emitting diode 230. The semiconductor light emitting diode 230 may include a first nitride semiconductor layer 130 doped as a first type, a first active layer 150 provided on the first nitride semiconductor layer 130, and a second nitride semiconductor layer 160 provided on the first active layer 150 and doped as a second type. The semiconductor light emitting diode 230 may emit light of a first wavelength. The nano light emitting diode array 240 may emit light of a second wavelength that is different from the first wavelength. The second wavelength may be longer than the first wavelength. When the light of the first wavelength and the light of the second wavelength are mixed, white light or pseudo-white light may be produced.

FIG. 3A illustrates a nano light emitting diode 270 that is one of various examples of a nano light emitting diode that may be used in the light emitting device 100 of FIG. 1. Referring to FIG. 3A, the nano light emitting diode 270 may include a third nitride semiconductor layer 272 doped as a p-type, a fourth nitride semiconductor layer 276 doped as an n-type, and a second active layer 274 provided between the third and fourth nitride semiconductor layers 272 and 276.

Referring back to FIG. 1, the light emitting device 100 may include a substrate 110, a buffer layer 120 formed on the substrate 110, the first nitride semiconductor layer 130 provided on the buffer layer 120, the first active layer 150 provided on the first nitride semiconductor layer 130, the second nitride semiconductor layer 160 provided on the first active layer 150, and the nano light emitting diode array 240 provided on the second nitride semiconductor layer 160. A first electrode 140 may be provided at one side of the first nitride semiconductor layer 130.

When the nano light emitting diode array 240 includes the nano light emitting diode 270 of FIG. 3A, a first transparent electrode layer 180 may be provided on the second nitride semiconductor layer 160 exposed between the nano light emitting diodes 270. The first transparent electrode layer 180 may contact the third nitride semiconductor layer 272. A second electrode 210 may be provided at one side of the first transparent electrode layer 180. The second transparent electrode layer 200 may be provided so as to contact an upper portion of the fourth nitride semiconductor layer 276. The second transparent layer 200 may also be provided so as not to contact the second electrode 210. A third electrode 220 may be provided at one side of the second transparent electrode layer 200. An insulation member 190 may be filled between the first and second transparent electrode layers 180 and 200 to electrically insulate the first transparent electrode layer 180 from the second transparent electrode layer 200. For example, the insulation member 190 may be filled in the space in the nano light emitting diode array 240.

In the light emitting device 100, the first transparent electrode layer 180 and the second transparent electrode layer 200 may be, respectively, a p-type electrode and an n-type electrode. Also, the first and second electrodes 140 and 210 may be connected to each other, and the second and third electrodes 210 and 220 may be connected to each other. Thus, the semiconductor light emitting diode 230 and the nano light emitting diode array 240 may be independently driven.

A sapphire substrate, a silicon carbide (SiC) substrate, or a GaN substrate may be used as the substrate 110. The first nitride semiconductor layer 130 may be a semiconductor layer doped as a first type and may be formed of a III-V group nitride semiconductor material (e.g., n-GaN). A first type dopant may be an n-type and Si may be used therefor. The buffer layer 120 for epitaxial growth may be further provided on the substrate 110.

The first active layer 150 may be a layer for emitting light through electron-hole recombination and may be formed of, for example, an InGaN based nitride semiconductor layer. The light emission wavelength range may be adjusted by controlling band gap energy. For example, the first active layer 150 may include a quantum well layer and a barrier layer, e.g., InGaN/GaN, InGaN/InGaN, InGaN/AlGaN, or InGaN/InAlGaN. The quantum well layer may be a single quantum well or a multi-quantum well of $In_xGa_{(1-x)}N$ $(0<x<1)/In_xAl_yGa_{(1-x-y)}N(0\leq x,y<1)$. In a non-limiting embodiment, the first active layer 150 may be configured to emit a first wavelength light (e.g., blue light). The In mole fraction in the InGaN layer may be determined so as to emit blue light. When the In mole fraction changes by about 1%, the light emission wavelength is shifted by about 5 nm. For example, when blue light is generated, the In mole fraction in the InGaN layer may be about 20%.

The second nitride semiconductor layer 160 may be a semiconductor layer doped as a second type and may be formed of a III-V group nitride semiconductor material (e.g., p-GaN). A second type dopant may be a p-type, and Mg, Ca, Zn, Cd, and/or Hg may be used therefor.

Although not illustrated, carrier confinement layers for improving internal quantum efficiency may be further provided between the first nitride semiconductor layer 130 and the first active layer 150 and/or between the first active layer 150 and the second nitride semiconductor layer 160. Also, although not illustrated, a contact layer overly doped with the second type dopant to lower contact resistance with the first transparent electrode 180 may be further included on the second nitride semiconductor layer 160. The contact layer may be a p-GaN layer.

In the manufacturing of the first nitride semiconductor layer 130, the first active layer 150, and the second nitride semiconductor layer 160, a variety of methods known as a III-V group compound semiconductor growth methods may be used. For example, a metal organic chemical vapor deposition (MOCVD) method, a hydride vapor phase epitaxy (HVPE) method, a molecular beam epitaxy (MBE) method, a metal organic vapor phase epitaxy (MOVPE) method, or a halide chemical vapor deposition (HCVD) method may be used therefor.

The nano light emitting diode array 240 emits light by being driven with current and is formed of the plurality of nano light emitting diodes 170 which may be arranged so as to be separated from each other. Referring to FIGS. 3A-3C, a variety of embodiments of the nano light emitting diodes 170, 270, 370, and 470 are described below.

The nano light emitting diodes 270, 370, and 470 may respectively include the third nitride semiconductor layers 272, 372, and 472 doped as a p-type, the fourth nitride semiconductor layers 276, 376, and 476 doped as an n-type, and the second active layers 274, 374, and 474, respectively, formed between the third nitride semiconductor layers 272, 372, and 472 and the fourth nitride semiconductor layers 276, 376, and 476. The nano light emitting diode 270 of FIG. 3A may have a nanorod structure. The nano light emitting diode 370 of FIG. 3B may have a core-shell nanorod structure. The nano light emitting diode 470 of FIG. 3C may have a nano-pyramid structure.

The nano light emitting diode 270 of FIG. 3A may have a nanorod structure in which the third nitride semiconductor layer 272, the second active layer 274, and the fourth nitride semiconductor layer 276 are sequentially deposited. The nano light emitting diode 370 of FIG. 3B may have a core-shell nanorod structure, in which the third nitride semiconductor layer 372 is provided as a core nanorod and the second active layer 374 and the fourth nitride semiconductor layer 376 are sequentially deposited around the core nanorod, forming a shell. In the core-shell structure, as a GaN semiconductor material having relatively high band-gap energy is employed in the shell, loss in surface recombination may be reduced due to the carrier confinement so that efficiency in the re-emission of light may be improved.

The nano light emitting diode 470 of FIG. 3C having a nano-pyramid structure may be formed by sequentially depositing the third nitride semiconductor layer 472, the second active layer 474, and the fourth nitride semiconductor layer 476. The nano-pyramid structure in which the surface area of the second active layer 274 is relatively large may result in a higher optical output.

The second active layers 274, 374, and 474 of the nano light emitting diodes 270, 370, and 470 of FIGS. 3A-3C may include a quantum well layer having a bandgap smaller than the bandgap of the first active layer 150 of the semiconductor light emitting diode 230. Each of the nano light emitting diodes 170, 270, 370, and 470 may include an InGaN based quantum well layer for emitting light of the second wavelength so as to produce white light or pseudo-white light when mixed with the light of the first wavelength emitted from the first active layer 150. For example, the light of the first wavelength may be a blue light and the light of the second wavelength may have a wavelength longer than the first wavelength.

The second active layers 274, 374, and 474 described with reference to FIGS. 3A-3C may be layers for emitting light through electron-hole recombination and may be formed of, for example, an InGaN based nitride semiconductor layer. The light emitting wavelength range of each of the second active layers 274, 374, and 474 may be adjusted by controlling bandgap energy. For example, each of the second active layers 274, 374, and 474 may include a quantum well layer and a barrier layer, for example, InGaN/GaN, InGaN/InGaN, InGaN/AlGaN, or InGaN/InAlGaN. Each of the second active layers may be a single quantum well or a multi-quantum well of $In_xGa_{(1-x)}N(0<x<1)/In_xAl_yGa_{(1-x-y)}N(0\leq x,y<1)$. The multi-quantum well layer may include a plurality of layers having different compositions of indium (In) in the $In_xGa_{(1-x)}N(0<x<1)$. Each of the second active layers 274, 374, and 474 may include an $In_xGa_{(1-x)}N(0<x<1)$ based quantum dot.

Each of the second active layers 274, 374, and 474 may include a quantum well layer for emitting yellow light so as to produce white light by being mixed with the blue light emission wavelength of the first active layer 150. For example, to produce yellow light, the In mole fraction in the InGaN layer may be about 40%.

Each of the second active layers 274, 374, and 474 may include an InGaN based quantum well layer for emitting light having a wavelength so as to produce pseudo-white light, for example, reddish or bluish white light, by being mixed with the blue light emission wavelength of the first active layer 150. For example, the In mole fraction in the InGaN layer of each of the second active layers 274, 374, and 474 may be selected within a range of about 20-45%.

The first active layer 150 may include an InGaN based quantum well layer that emits the light of the first wavelength, and each of the second active layers 274, 374, and 474 may include an InGaN based quantum well layer that emits the light of the second wavelength through a bandgap smaller than that of the first active layer 150. The light of the first wavelength may have a wavelength shorter than the second wavelength.

The third nitride semiconductor layer and the fourth nitride semiconductor layer described with reference to FIGS. 3A-3C may include an $In_xAl_yGa_{(1-x-y)}N(0\leq x,y<1)$ layer. The width of each of the nano light emitting diodes 270 and 370 of FIGS. 3A and 3B may have a range of about 10 nm to about 5,000 nm. Each of the nano light emitting diodes 270 and 370 described in FIGS. 3A and 3B may be grown by a general nanorod growth method. For example, the nano light emitting diodes 170, 270, and 370 may be grown in a vapor-liquid-solid (VLS) process by using a metal catalyst such as Fe, Ni, Au, or In. Alternatively, a template layer (not shown) may be formed and a predetermined hole may be formed therein so that the nano light emitting diodes 170, 270, and 370 may be grown in the hole. The nano light emitting diode 470 of a nano-pyramid structure in FIG. 3C may be grown on the second nitride semiconductor layer 160 by using a selective area growth (SAG) method. The nano light emitting diodes 170, 270, and 370 may be grown by another growth method such as a metal organic chemical vapor deposition (MOCVD) method, a hydride vapor phase epitaxy (HVPE) method, a molecular beam epitaxy (MBE) method, a metal organic vapor phase epitaxy (MOVPE) method, or a halide chemical vapor deposition (HCVD) method.

In the light emitting device 100 of FIG. 1, the first and second electrodes 140 and 210 may be connected to an external power supply unit to inject electrons and holes into the first active layer 150, and the second and third electrodes 210 and 220 may be connected to the external power supply unit to inject electrons and holes into the second active layer. The first, second, and third electrodes 140, 210, and 220 may be formed of a transparent conductive material, for example, a metal material such as Au, Al, or Ag, or indium tin oxide (ITO). The light emitting diode 100 may have a mesa structure in which a partial area of the first nitride semiconductor layer 130 is exposed. The first electrode 140 may be provided in the exposed partial area of the first nitride semiconductor layer 130. The second electrode 210 may be provided at one side of an upper surface of the first transparent electrode layer 180. The third electrode 220 may be provided at one side of an upper surface of the second transparent electrode layer 200.

The first transparent electrode layer 180, as illustrated in FIGS. 1 and 2, may be provided on the second nitride semiconductor layer 160 or a contact layer (not shown), and/or in the nano light emitting diode array 240. The second transparent electrode layer 200, as illustrated in FIGS. 1 and 2, may be provided on the insulation member 190 filled in the nano light emitting diode array 240 and simultaneously above the nano light emitting diode array 240 to contact the fourth nitride semiconductor layer 276. The insulation member 190 may be formed of a general dielectric material (e.g., SiO$_2$ or Si$_2$N$_4$), or an organic material.

In the light emitting device 100 configured as above, the light of the first wavelength generated by the first active layer 150 and the light of the second wavelength generated by the second active layers 274, 374, and 474 may be emitted so as to mix with each other, thereby producing white light. For example, the light of the first wavelength may include blue light, whereas the light of the second wavelength may include yellow light. Alternately, the light of the first wavelength may include blue light, whereas the light of the second wavelength may include a wavelength that may produce pseudo-white light upon mixing with the blue light. Because the second active layers 274, 374, and 474 may have a nanorod or nano-pyramid structure, a crystal defect may be relatively low and internal quantum efficiency and optical extraction efficiency may be improved as a result of the optical confinement effect.

In FIG. 1, the nano light emitting diode array 240 may be provided on the second nitride semiconductor layer 160. Although not shown, a vertical type light emitting device may also be implemented. For instance, after the semiconductor light emitting diode 230 and the nano light emitting diode array 240 are grown, the substrate 110 of FIG. 1 may be removed and a first electrode may be provided on the lower surface of the first nitride semiconductor layer 130.

As described above, because white light or pseudo-white light may be produced without using a fluorescent material, a manufacturing process may be simplified and costs may be reduced. Also, because white light or pseudo-white light may be produced by multiple wavelength divergence from the injection of current, real time white light color coordinate control is available. The nano light emitting diode may have relatively few crystal defects so that higher internal quantum efficiency may be attained and optical extraction efficiency may be improved.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A light emitting device comprising:
a semiconductor light emitting diode which comprises a first nitride semiconductor layer of an n-type, a second nitride semiconductor layer of a p-type, and a first active layer between the first and second nitride semiconductor layers;
a nano light emitting diode array which comprises a plurality of nano light emitting diodes on the semiconductor light emitting diode, each of the plurality of nano light emitting diodes including a second active layer;
a first electrode at an end portion of the first nitride semiconductor layer;
a first transparent electrode layer on the second nitride semiconductor layer, the first transparent electrode layer being between the plurality of nano light emitting diodes;
a second electrode at an end portion of the first transparent electrode layer;
a second transparent electrode layer on the plurality of nano light emitting diodes;
an insulation member between the first transparent electrode layer and the second transparent electrode layer, the plurality of nano light emitting diodes extending through the insulation member and terminating at the second transparent electrode layer so as to not extend into the second transparent electrode layer; and
a third electrode at an end portion of the second transparent electrode layer, the third electrode being between the first electrode and the second electrode, the third electrode being closer to the first electrode than the second electrode,
wherein the first active layer emits light of a first wavelength and the second active layer emits light of a second wavelength that is longer than the first wavelength, the light emitting device configured such that the light of the first wavelength and the light of the second wavelength mix to produce white light or pseudo-white light.

2. The light emitting device of claim 1, wherein each of the plurality of nano light emitting diodes comprises:
a third nitride semiconductor layer of a p-type;
a fourth nitride semiconductor layer of an n-type; and
the second active layer between the third and fourth nitride semiconductor layers.

3. The light emitting device of claim 2, wherein the second transparent electrode layer is on the fourth nitride semiconductor layer.

4. The light emitting device of claim 3, wherein the first electrode and the second electrode are connected to each other, the second electrode and the third electrode are connected to each other, and the semiconductor light emitting diode and the nano light emitting diode array are configured to be independently driven.

5. The light emitting device of claim 3, wherein the first transparent electrode layer is of a p-type, and the second transparent electrode layer is of an n-type.

6. The light emitting device of claim 2, wherein the first active layer comprises an InGaN based quantum well layer configured to emit blue light, and the second active layer comprises an InGaN based quantum well layer configured to emit light of a wavelength that is mixed with the blue light to produce white light.

7. The light emitting device of claim 2, wherein the first active layer comprises an InGaN based quantum well layer and the second active layer comprises an InGaN based quantum well layer and has a smaller bandgap than that of the first active layer.

8. The light emitting device of claim 2, wherein the first active layer comprises an InGaN based quantum well layer configured to emit blue light, and the second active layer comprises an InGaN based quantum well layer configured to emit light of a wavelength that is mixed with the blue light to produce pseudo-white light.

9. The light emitting device of claim 2, wherein the second active layer comprises an InGaN based quantum well layer configured to emit yellow light.

10. The light emitting device of claim 1, wherein each of the plurality of nano light emitting diodes has a nanorod structure.

11. The light emitting device of claim 1, wherein each of the plurality of nano light emitting diodes has a nano-pyramid structure.

12. The light emitting device of claim 2, wherein each of the plurality of nano light emitting diodes has a core-shell nanorod structure, the third nitride semiconductor layer being configured as a core nanorod and the second active layer and the fourth nitride semiconductor layer being configured as a shell around the core nanorod.

13. The light emitting device of claim 2, wherein the third and fourth nitride semiconductor layers comprise $In_xAl_yGa_{(1-x-y)}N(0 \leq x, y < 1)$, and the second active layer comprises $In_xGa_{(1-x)}N(0 < x < 1)$.

14. The light emitting device of claim 2, wherein the first active layer and the second active layer comprise a multi-quantum well layer formed of $In_xGa_{(1-x)}N(0 < x < 1)/In_xAl_yGa_{(1-x-y)}N(0 \leq x, y < 1)$.

15. The light emitting device of claim 14, wherein the multi-quantum well layer comprises a plurality of layers having different compositions of indium (In) in the layers formed of $In_xGa_{(1-x)}N(0 < x < 1)$.

16. The light emitting device of claim 1, wherein each of the plurality of nano light emitting diodes has a width in a range of about 10 nm to about 5000 nm.

17. The light emitting device of claim 1, wherein the first transparent electrode layer surrounds a base of the plurality of nano light emitting diodes.

18. The light emitting device of claim 17, wherein the plurality of nano light emitting diodes extend through the first transparent electrode layer.

19. The light emitting device of claim 1, wherein the plurality of nano light emitting diodes penetrate the first transparent electrode layer so as to contact the second nitride semiconductor layer and penetrate the insulation member so as to contact the second transparent electrode layer.

20. The light emitting device of claim 1, wherein an uppermost surface of the second electrode is higher than that of the second transparent electrode layer.

* * * * *